Feb. 2, 1965 D. SHEFFET 3,168,650
LOW NOISE TRANSISTOR CIRCUIT
Filed Aug. 15, 1960
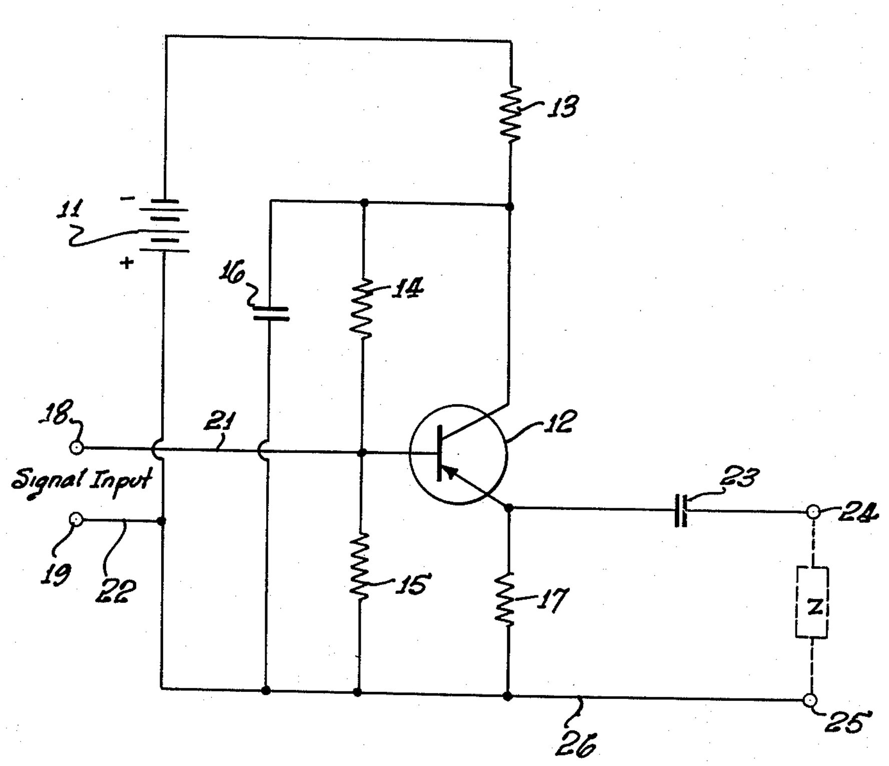
DAVID SHEFFET,
INVENTOR.
BY Spencer & Horn
ATTORNEYS.

United States Patent Office 3,168,650
Patented Feb. 2, 1965

3,168,650
LOW NOISE TRANSISTOR CIRCUIT

David Sheffet, Altadena, Calif., assignor to Western Geophysical Company of America, Los Angeles, Calif., a corporation of Delaware Filed Aug. 15, 1960, Ser. No. 49,718
4 Claims. (Cl. 307—88.5)

This invention pertains to electronic circuitry utilizing transistors and more particularly to low noise emitter follower circuits.

The vacuum tube cathode follower circuit is widely used as an impedance matching device to permit the efficient transfer of power from a circuit having a relatively high output impedance into a low impedance load. Similar circuitry has been evolved for transistor operation, such circuitry being commonly known as an "emitter follower" circuit. A certain amount of noise is generated within a transistor during operation and such noise can frequently present a problem if it is greatly amplified by successive stages. Hence, if an emitter follower is used to transfer the output of a weak signal source into a low input impedance of the first of a series of cascaded high gain amplifier stages it is desirable to minimize the noise originating in the emitter follower stage.

It is therefore an object of the present invention to provide low noise emitter follower transistor circuitry.

It is another object of the present invention to provide low noise emitter follower transistor circuitry in which there is no significant sacrifice of gain.

Other objects and a fuller understanding of the invention may be had by referring to the following description and claims, taken in conjunction with the accompanying drawing, in which there is shown the circuit diagram of the preferred embodiment of the invention. A specific application of the preferred embodiment of the present invention is disclosed in co-pending patent application Serial No. 54,505 filed October 10, 1960, entitled "Geophysical Amplifier," and also assigned to Western Geophysical Company of America.

The objects of the present invention are accomplished by providing an emitter follower circuit in which the resistance of the emitter resistor is at least 50 times as great as the input impedance of the following stage.

Referring now to the drawing, there is shown a battery 11 which provides a source of D.-C. supply voltage for the operation of a PNP-type transistor 12. A filter network, consisting of series resistor 13 and a shunt capacitor 16, serves to decouple the emitter follower stage from the D.-C. supply voltage source. A resistor 14 connects the transistor base to the junction of the resistor 13, the capacitor 16 and the transistor collector. A resistor 15 connectes the transistor base to the positive terminal of battery 11, the resistors 14 and 15 thereby forming a voltage divider network to set the operating potential level of the transistor base. An emitter resistor 17 connects the emitter of the transistor 12 with the positive terminal of the D.-C. supply source 11. A pair of signal input terminals 18 and 19 are provided to connect with a signal voltage source, the terminal 18 being connected directly to the transistor base through a connecting lead 21, and the terminal 19 connected to the transistor emitter through a connecting lead 22 and the emitter resistor 17. Output voltage is taken from the transistor emitter through an output coupling capacitor 23 and applied to an output terminal 24. A common output terminal 25 is connected to the transistor emitter through a connecting lead 26 and through the emitter resistor 17. The output of the emitter follower stage is passed through output terminals 24 and 25 to the relatively low input impedance of a following stage (shown by dotted line) which has a predetermined load resistance.

The inventor has discovered that if the resistance of the emitter resistor 17 is at least 50 times as great as the effective input impedance of the following stage the emitter follower noise will be greatly reduced and there will be no significant sacrifice of gain. The remainder of the emitter follower circuit parameters are determined in the usual manner, subject to the provision that the resistance of the emitter resistor 17 must be of the aforementioned relatively high value. Ratios of emitter resistor to following stage input impedance greater than 50:1 provide further reductions in transistor noise with the relative reductions in noise becoming asymptotically smaller with increasing ratios. Usual values of emitter resistors in prior art emitter followers are on the order of hundreds of ohms, and seldom higher than one or two thousand ohms. On the other hand, although one would ordinarily attempt to decrease noise by decreasing the resistance of the emitter resistor, typical values of emitter resistors in the circuit of the present invention range from 50,000 ohms to 500,000 ohms. Values higher than 500,000 ohms are feasible because the circuitry is self-balancing to a degree and in a given circuit the resistance of the emitter resistor can be varied over a wide range without changing the stage operating characteristics. The self-balancing feature arises from the fact that an increase in the resistance of the emitter resistor causes an increase in the effective D.C. operating potential applied to the base of the transistor, by effectively increasing the value of resistance in shunt with the voltage divider resistor 15 in the figure of the accompanying drawing. Although emitter resistors having resistances higher than 500,000 ohms are feasible, higher values are not usually used in geophysical applications (noise from the preceding stage is greater and is not removed in this stage) because the relative decrease in noise is slight and because of the extremely wide range of temperature stability required in such applications.

As a practical illustration of typical circuit parameters of the preferred embodiment of the present invention, its use in the geophysical amplifier of the aforementioned co-pending patent application required the transference of seismic signals with the 30 to 100 cycle per second range from a stage having a relatively high output impedance into a stage having an effective load impedance of about 2200 ohms. Referring again to the accompanying drawing, the supply voltage of battery 11 was 26 volts. The PNP transistor selected was of the 2N527 type. The resistance of the decoupling resistor 13 was made 20K ohms and the capacitance of the decoupling capacitor 16 made 55 microfarads. The emitter resistor 17 was made 51K ohms and an output coupling capacitor 23 of 55 microfarads was specified. Resistance values of 100,000 ohms and 1 megohm were selected for voltage divider network resistors 14 and 15 respectively. The use of these circuit parameters in the aforementioned geophysical amplifier resulted in a better than 2 to 1 reduction in noise factor when replacing a conventionally designed emitter follower.

Although the particular circuit parameters of the parameters of the preceding example were for use with a following stage having an effective input impedance of about 2200 ohms, lower effective input indpedances are more commonly encountered in transistor amplifier stages, typical values being only a few hundred ohms. With such lower following stage input impedances the low noise circuitry of the present invention will provide equally satisfactory results.

Although the present invention has been described with a certain degree of particularity, it is understood that the present disclosure has been made only by way of example and that numerous changes in the details of the circuitry and the combination and arrangement of parts may be resorted to without departing from the spirit and scope of the invention as hereinafter claimed. For example, an NPN-type transistor can be substituted for the PNP-type illustrated, accompanied by reversal of the supply voltage polarity. And, although the circuit of the present invention was illustrated as being particularly applicable to geogphysical apparatus operating within the frequency range of from 30 to 100 cycles per second, the circuit is equally useable at frequencies on the order of thousands of cycles.

What is claimed is:

1. In a transistor emitter follower circuit powered from a direct current potential source and for transmitting signal voltages within the frequency range of from about 30 to 100 cycles per second from a preceding stage having a relatively high output impedance to a following stage having a predetermined relatively low input impedance; a transistor having at least a base, an emitter and a collector; resistive circuit means for coupling said direct current potential source to said collector, to said base and to a point of common potential to thereby establish the D.C. potential levels of said collector and said base with respect to said point of common potential; input circuit means for impressing signal voltages between said base and said point of common potential; and, output circuit means including an emitter resistor connected between said emitter and said point of common potential, the resistance value of said emitter resistor being at least 50 times as great as said predetermined input impedance of said following stage.

2. A low noise transistor emitter follower circuit comprising in combination: a transistor having a base element, an emitter element and a collector element; first and second electrical leads adapted for the connection thereacross of a source of electrical input signals, said first electrical lead being connected to the base element of said transistor, said second electrical lead being connected to a point of common potential; a source of direct current potential resistively coupled between the collector element of said transistor and said point of common potential; a first resistor connected between the collector element of said transistor and the base element of said transistor; a second resistor connected between the base element of said transistor and said point of common potential, the resistance values of said first and second resistors being selected to set the operating potential levels of the collector and base elements of said transistor at predetermined values; third and fourth electrical leads adapted for the connection thereacross of the input circuit of a following stage having a predetermined input impedance, said third electrical lead being electrically coupled to the emitter element of said transistor, said fourth electrical lead being connected to said point of common potential; and a third resistor connected between the emitter element of said transistor and said point of common potential, the resistance value of said third resistor being at least fifty times as great as said predetermined input impedance of said following stage.

3. A low noise transistor emitter follower circuit comprising in combination: a transistor having a base element, an emitter element and a collector element; first and second electrical leads adapted for the connection thereacross of a source of electrical input signals, said first electrical lead being connected to the base element of said transistor, said second electrical lead being connected to a point of common potential; a source of direct current potential, one terminal of said potential source being connected through resistive means to the collector element of said transistor, the other terminal of said potential source being connected to said point of common potential; a capacitor connected between the collector element of said transistor and said point of common potential; a first resistor connected between the collector element of said transistor and the base element of said transistor; a second resistor connected between the base element of said transistor and said point of common potential, the resistance values of said first and second resistors being selected to set the operating potential levels of the collector and base elements of said transistor at predetermined values; third and fourth electrical leads adapted for the connection thereacross of the input circuit of a following stage having a predetermined input impedance, said third electrical lead being capacitively coupled to the emitter element of said transistor, said fourth electrical lead being connected to said point of common potential; and a third resistor connected between the emitter element of said transistor and said point of common potential, the resistance value of said third resistor being at least fifty times as great as said predetermined input impedance of said following stage.

4. A low noise transistor emitter follower circuit comprising in combination: a transistor having at least a base element, an emitter element and a collector element; first and second electrical leads adapted for the connection thereacross of a source of electrical input signals, said first lead to be connected to the base element of said transistor, said second lead being connected to a point of common potential; a source of direct current potential electrically coupled between the collector element of said transistor and said point of common potential; first resistance means connected between the collector element of said transistor and the base element of said transistor; second resistance means connected between the base element of said transistor and said point of common potential, the resistance values of said first and second resistance means being selected to set the operating potential levels of the collector and base elements of said transistor at predetermined values; third and fourth electrical leads adapted for the connection thereacross of the input circuit of a following stage having a predetermined input impedance, said third electrical lead being electrically coupled to the emitter element of said transistor, said fourth electrical lead being connected to said point of common potential; and third resistance means connected between the emitter element of said transistor and said point of common potential, the resistance value of said third resistance means being at least fifty times as great as said predetermined input impedance of said following stage.

References Cited by the Examiner

UNITED STATES PATENTS 2,585,077 2/52 Barney ---------------- 330—32

JOHN W. HUCKERT, *Primary Examiner.*

GEORGE N. WESTBY, ARTHUR GAUSS, *Examiners.*